United States Patent [19]

Foerstner et al.

[11] Patent Number: 5,256,581
[45] Date of Patent: Oct. 26, 1993

[54] SILICON FILM WITH IMPROVED THICKNESS CONTROL

[75] Inventors: Juergen A. Foerstner, Mesa; Henry G. Hughes; Frank S. D'Aragona, both of Scottsdale, all of Ariz.

[73] Assignee: Motorola, Inc., Schaumburg, Ill.

[21] Appl. No.: 751,001

[22] Filed: Aug. 28, 1991

[51] Int. Cl.$^5$ .................... H01L 21/306; H01L 21/84
[52] U.S. Cl. ........................ 437/24; 437/61; 437/974
[58] Field of Search ............ 437/24, 61, 974; 148/DIG. 135

[56] References Cited

U.S. PATENT DOCUMENTS

| | | | |
|---|---|---|---|
| 4,601,779 | 7/1986 | Abernathey et al. | 437/24 |
| 4,771,016 | 9/1988 | Bajor et al. | 148/DIG. 135 |
| 4,983,251 | 1/1991 | Haisma et al. | 437/974 |
| 5,034,343 | 7/1991 | Rouse et al. | 437/974 |
| 5,110,748 | 5/1992 | Sarma | 437/974 |
| 5,131,963 | 7/1992 | Ravi | 437/974 |
| 5,147,808 | 9/1992 | Pronko | 148/DIG. 135 |
| 5,168,078 | 12/1992 | Reisman et al. | 148/DIG. 135 |

FOREIGN PATENT DOCUMENTS 60-219764 11/1985 Japan.

Primary Examiner—Olik Chaudhuri
Assistant Examiner—Ourmazd S. Ojan
Attorney, Agent, or Firm—Joe E. Barbee

[57] ABSTRACT

A method of fabricating a silicon film with improved thickness control and low defect density. The method comprises implanting a silicon wafer (19) with hydrogen ions to produce a layer of n-type silicon (18) having a precisely controlled thickness. Bonding the n-type silicon layer (18) to an oxidized surface (17) of a handle wafer (21) while using a temperature of 200 degrees Celsius. Etching the silicon wafer (19) to the boundary of the n-type layer (18). Annealing the silicon to drive out the hydrogen ions, leaving a silicon film (18) with a precisely controlled thickness and of the same type as the original silicon wafer (19).

7 Claims, 1 Drawing Sheet

SILICON FILM WITH IMPROVED THICKNESS CONTROL

BACKGROUND OF THE INVENTION

The present invention relates, in general, to semiconductor device manufacture, and more particularly to a method for producing a thin semiconductor wafer suited to integrated circuit manufacture.

One of the fundamental parameters of integrated circuit manufacture is the electrical isolation which is provided between the different devices which comprise the integrated circuit. It has long been recognized that isolation using a high quality dielectric material, or "dielectric isolation" such as silicon dioxide, greatly enhances the performance of integrated circuits in just about every way. For example, integrated circuits intended for military applications which must operate in the presence of ionizing radiation typically use some form of dielectric isolation.

Numerous methods of fabricating such dielectric isolated integrated circuits have been used in the past, including methods such as silicon on sapphire and epitaxial lateral overgrowth of silicon on an oxide isolation layer. Another technique is called separation by oxygen implantation or SIMOX. The SIMOX process relies on implantation of oxygen ions beneath the surface of the silicon to create a buried oxide layer. This process allows the depth of the implant to be precisely controlled, but costs approximately $450 per wafer and has a high defect density. More recently bonded wafer techniques have lowered the cost of dielectric isolation to approximately $100 per wafer. For integrated circuit manufacturing, these bonded wafer techniques typically bond an active wafer to a silicon dioxide layer which has been grown on a handle wafer. The active wafer is then thinned by a grinding process to achieve a desired thickness of the silicon film. These bonded wafer techniques can produce a silicon film having a low defect density, but with poor control of thickness of the silicon film above the oxide.

Methods developed for the fabrication of thin silicon membranes have addressed this problem by the addition of an etch step following mechanical removal of excess silicon. This produces a silicon film with a defect density which is too high to use for integrated circuit manufacturing. The prior art method of etching to produce a thin silicon film for membranes is described in a paper entitled "Fabrication and Characterization of Si Membranes" by E. D. Palik, 0. J. Glembocki, and R. E. Stahlbush in Journal of the Electrochemical Society: Solid-State Science and Technology, Vol. 135, No. 12, December 1988, which is incorporated herein by reference. Briefly, a wafer is fabricated having a thin p+ layer with a doping concentration of approximately $10^{20}$ atoms $cm^{-3}$ of boron. The silicon film is epitaxially grown on top of this thin p+ layer. After grinding away most of the excess silicon the membrane area is etched using the p+ layer as an etch stop. This method has been applied to commercially available silicon wafers. These wafers provide a silicon film with good thickness control, but an unacceptably high defect density due to the heavy doping of boron ions required for the thin p+ layer. This makes the method unsuitable for fabrication of silicon wafers to be used for high density integrated circuits.

There is a need for a method to produce dielectrically isolated silicon films, suited for integrated circuit manufacture, which can combine the low cost and low defect density of bonded wafers with the accurate thickness control of SIMOX.

SUMMARY OF THE INVENTION

Briefly stated, the present invention provides a method of fabricating a silicon film with improved thickness control. This comprises implanting a silicon wafer with hydrogen ions to produce a layer of n-type silicon having a precisely controlled thickness. The n-type silicon layer is bonded to an oxidized surface of a handle wafer while using a temperature of approximately 200 degrees Celsius. The silicon wafer is next etched to the boundary of the n-type layer which acts as an etch stop. The silicon is then annealed to drive out the hydrogen ions, leaving a silicon film with a precisely controlled thickness and of the same dopant type and concentration as the original silicon wafer. The anneal step also acts to strengthen the bond between the two wafers.

DETAILED DESCRIPTION OF THE INVENTION

Figure 1:
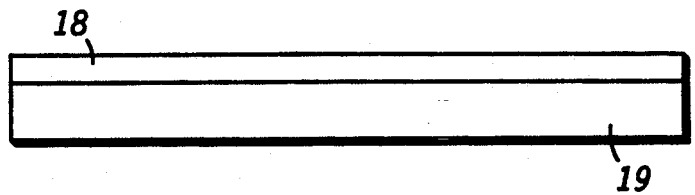
FIG. 1 shows a cross sectional view of an active silicon wafer according to the present invention.

FIG. 1 shows a cross sectional view of an active silicon wafer 19 as a preferred embodiment of the present invention. Active wafer 19 is typically fabricated from a lightly doped p-type silicon material, and has a layer 18. Layer 18 is a layer of n-type silicon created through n-type epitaxial deposition or by ion implantation of hydrogen ions. This latter method is described in a paper entitled "Deactivation of the Boron acceptor in silicon by Hydrogen" by Chin-Tang Sah, Jack Yuan-Chen Sun, and Joseph Jeng-Tao Tzou, Appl. Phys. Lett., Vol 43, No. 2, 15 July 1983, which is incorporated herein by reference. This method has several useful properties, the implanted layer's depth and doping concentration can be precisely controlled, there is minimal disruption of the silicon crystal matrix, and a subsequent high temperature annealing step will drive out the hydrogen ions to return the material to its original doping state. The ion implantation thus allows layer 18 to have a precisely controlled thickness. Layer 18 is typically fabricated to be approximately 0.05 to 5 micro meters thick, but may be easily adjusted to achieve other desired thicknesses.

Figure 2:
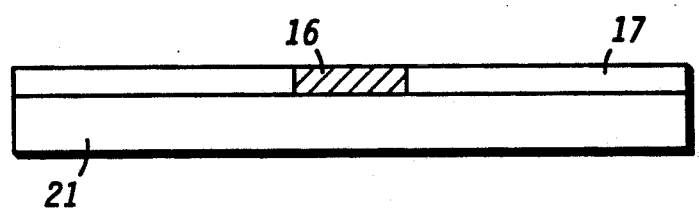
FIG. 2 shows a cross sectional view of a silicon handle wafer according to the present invention.

FIG. 2 shows a handle wafer 21 with an oxidized surface 17. Oxidized surface 17 is typically a silicon oxide material having a thickness of approximately 5000 angstroms. A hole is cut in oxidized surface 17 near the center of the wafer using photolithographic techniques well known in the art. Tungsten silicide is deposited on the oxidized surface and in the hole to form a tungsten silicide electrode or conductive plug 16. The top surface of oxidized surface 17 and conductive plug 16 are then polished to produce a smooth surface for bonding.

Conductive plug 16 is typically fabricated near the center of the wafer, but may be made in any desired position and shape so as to provide a low impedance electrical path across oxide layer 17. Thus conductive plug 16 serves as a tungsten silicide electrode attached to handle wafer 21 which electrically couples handle wafer 21 to layer 18 after active wafer 19 and handle wafer 21 are bonded together. Alternative embodiments of this invention use metals other than tungsten to fabricate conductive plug 16. Another embodiment substitutes a biasing means other than conductive plug 16 to couple the bias voltage to layer 18 during etching.

Figure 3:
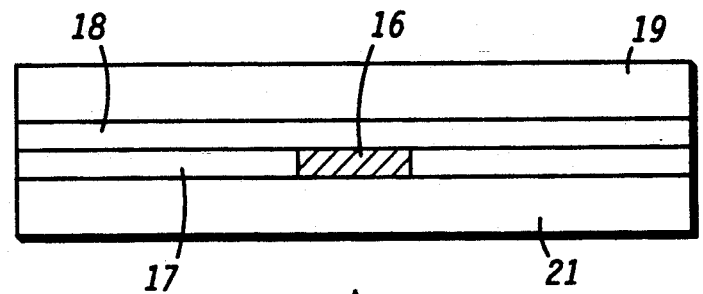
FIG. 3 shows a cross sectional view of the silicon wafers of FIG. 1 and FIG. 2 bonded together according to the present invention.

FIG. 3 shows a cross sectional view of active wafer 19 and handle wafer 21 bonded together to form a composite wafer 22 as the preferred embodiment of the present invention. Active wafer 19 is attached to handle wafer 21 by bonding the surface of layer 18 to the surface of oxidized surface 17 and conductive plug 16. This bonding is performed at a temperature between 100 and 200 degrees Celsius with a preferred temperature of 200 degrees Celsius. Bonding at this low temperature produces a bond which has adequate strength for further processing, but at the same time does not disturb the implanted hydrogen ions.

Figure 4:
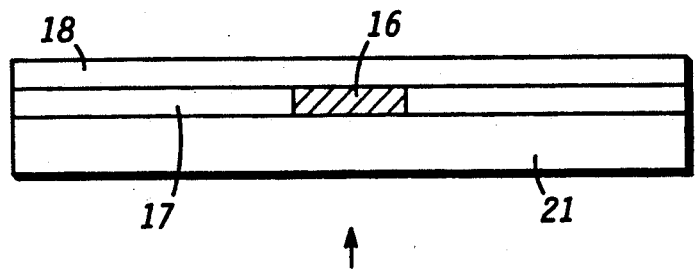
FIG. 4 shows a cross sectional view of the wafers depicted in FIG. 3 after material removal according to the present invention.

FIG. 4 shows a cross sectional view of bonded wafers after material removal as the preferred embodiment of the present invention. A mechanical grinding process well known in the art is used to remove silicon from active wafer 19 to within 20 to 100 micrometers of the bonded oxide interface. This mechanical grinding is used solely to more rapidly remove the excess silicon material. Alternative embodiments of the invention use different means to remove this material, such as abrasion or scraping. Another embodiment of this invention uses no grinding step at all.

Next an etch step is used to remove the excess silicon material of active wafer 19, stopping at the boundary of layer 18. This requires an "Etch-Stop" mechanism such as described in a paper entitled "Study of the Etch-Stop Mechanism in Silicon", by E.D. Palik, J.W. Faust, Jr., H.F. Gray, and R.F. Greene, in Journal of the Electrochemical Society: Solid-State Science and Technology, Vol. 129, No. 9, September 1982, which is incorporated herein by reference. Alternative embodiments of the present invention use methods such as those described in the above article to achieve an etch which will accurately remove the excess silicon.

In the preferred embodiment active wafer 19 is etched using an electrochemically assisted etch. An electrical bias is applied between active wafer 19 and handle wafer 21. This electrical bias comprises a positive voltage applied to handle wafer 21 and a negative voltage applied to active wafer 19. This voltage is coupled to layer 18 through conductive plug 16. The electrical bias results in a reverse biased diode formed by layer 18 and p-type active wafer 19. Silicon material is thus removed from active wafer 19 until the p-n junction is reached. This leaves a layer 18 of n-type silicon with a precisely controlled thickness on top of oxidized surface 17 and conductive plug 16.

Finally the composite wafer is annealed by heating to a temperature of 1200 degrees Celsius for one hour. The annealing may be performed with temperatures ranging from 700 to 1250 degrees Celsius. This annealing achieves several desirable effects. The implanted hydrogen ions are driven from layer 18 leaving a silicon film on top of a silicon dioxide layer. Layer 18 now has essentially the same impurity doping as the starting material used for active wafer 19. Annealing repairs any damage to the silicon crystal lattice which was caused by implantation and etching. In addition, annealing strengthens the weak bond between layer 18 and oxidized surface 17. The result, in the preferred embodiment, is a thin film 18 of lightly doped p-type silicon electrically isolated by a layer of silicon dioxide and mechanically supported by handle wafer 21. Conductive plug 16 is patterned to provide low impedance electrical coupling between desired areas of layer 18 and handle wafer 21, thus providing a low impedance electrical ground return path where desired.

By now it should be clear that the present invention comprises a method to produce a dielectric isolated silicon film, suitable for integrated circuit manufacturing, which combines the low cost and defect density of bonded wafers with the accurate thickness control of SIMOX. The method can fabricate a very thin film of silicon on top of a silicon dioxide isolation layer. The method according to the present invention can potentially produce wafers having this silicon film for approximately $40 per wafer, this compares favorably with prior art methods which cost at least $100 per wafer. The silicon film has a very low defect density, is electrically isolated by a silicon dioxide layer, and has a thickness which is precisely controlled.

We claim:

1. A method of fabricating a silicon film with improved thickness control, comprising:
    providing an active wafer of silicon material;
    implanting the active wafer with hydrogen ions to produce a layer of n-type silicon having a precisely controlled thickness;
    providing a handle wafer having at least one oxidized surface;
    bonding the n-type silicon layer to the oxidized surface of the handle wafer using a temperature of 200 degrees Celsius;
    etching the active wafer to the boundary of the n-type layer; and
    annealing the n-type silicon layer to drive out the hydrogen ions, leaving a silicon film on top of a silicon dioxide insulating layer.

2. The method of claim 1 wherein etching of the active wafer is preceded by mechanically grinding away excess silicon to a thickness.

3. The method of claim 1 wherein providing the active wafer comprises providing a p-type silicon wafer, and etching is an electrochemical etch using an etchant which selectively etches the p-type material such that etching stops at a p-n junction.

4. The method of claim 1 further comprising:
    providing a tungsten silicide electrode attached to the handle wafer which electrically couples the handle wafer to the implanted n-type silicon layer after the active wafer and the handle wafer are bonded together; and
    mechanically polishing both the tungsten silicide electrode and the oxidized surface of the handle wafer to provide a uniform surface for bonding.

5. A method of fabricating a silicon film with improved thickness control, comprising:
    providing an active wafer;
    implanting the active wafer with hydrogen ions to produce a layer of n-type silicon having a precisely controlled thickness;
    providing a handle wafer having an oxidized layer with an upper surface;

forming a conductive plug through the oxidized layer, the conductive slug being polished flush with the upper surface of the oxidized layer;

bonding the n-type silicon layer to the oxidized handle wafer to produce a composite wafer;

etching the composite wafer to the boundary of the n-type layer; and annealing the composite wafer to drive out the hydrogen ions, leaving a silicon film having a precisely controlled thickness.

6. A method of fabricating a silicon film with improved thickness control, comprising:

providing an active wafer having p-type doping;

implanting the active wafer with hydrogen ions to produce a layer of n-type silicon having a precisely controlled thickness and forming a p-n junction;

etching a hole in an oxidized surface of an oxidized handle wafer having a desired position and shape;

depositing tungsten silicide onto the oxidized surface and into the hole;

polishing the tungsten silicide and the oxidized surface to produce a smooth surface for bonding;

bonding the n-type silicon layer to the oxidized handle wafer using a temperature of less than 200 degrees Celsius to produce a composite wafer;

mechanically grinding the surplus silicon from the active wafer to leave a predetermined thickness of silicon above the n-type silicon film;

electrochemically etching the composite wafer using an etchant which selectively etches the p-type material such that etching stops at the p-n junction; and annealing the composite wafer to drive out the hydrogen ions, leaving a p-type silicon film having a precisely controlled thickness.

7. A method of fabricating a silicon film with improved thickness control, comprising:

providing an active wafer;

epitaxially depositing an n-type layer of silicon onto the surface of the active wafer;

providing a handle wafer having an oxidized layer with a conductive plug through the oxidized layer and which is polished to be flush with a surface of the oxidized layer;

bonding the n-type silicon layer of the active wafer to the oxidized layer of the handle wafer to produce a composite wafer;

removing silicon from the active wafer by mechanical means to a predetermined thickness above the n-type silicon film;

etching the composite wafer until only the n-type silicon layer remains; and annealing the composite wafer.

* * * * *